United States Patent
Hernon et al.

(10) Patent No.: US 7,929,306 B2
(45) Date of Patent: Apr. 19, 2011

(54) CIRCUIT PACK COOLING SOLUTION

(75) Inventors: Domhnaill Hernon, Bettystown (IE);
Todd R. Salamon, Summit, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/415,745

(22) Filed: Mar. 31, 2009

(65) Prior Publication Data

US 2010/0246128 A1    Sep. 30, 2010

(51) Int. Cl.
*H05K 7/20* (2006.01)

(52) U.S. Cl. ....... 361/700; 361/699; 361/704; 174/15.2; 165/80.4; 165/104.26

(58) Field of Classification Search .......................... None
See application file for complete search history.

(56) References Cited

U.S. PATENT DOCUMENTS

| | | | |
|---|---|---|---|
| 4,688,399 A | 8/1987 | Reimann | |
| 5,216,580 A * | 6/1993 | Davidson et al. | 361/700 |
| 5,355,942 A * | 10/1994 | Conte | 165/104.33 |
| 5,386,143 A * | 1/1995 | Fitch | 257/715 |
| 5,409,055 A * | 4/1995 | Tanaka et al. | 165/104.33 |
| 6,104,611 A * | 8/2000 | Glover et al. | 361/700 |
| 6,118,654 A * | 9/2000 | Bhatia | 361/679.52 |
| 6,625,024 B2 * | 9/2003 | Mermet-Guyennet | 361/700 |
| 6,665,187 B1 * | 12/2003 | Alcoe et al. | 361/719 |
| 6,666,260 B2 * | 12/2003 | Tantoush | 165/80.3 |
| 6,675,887 B2 * | 1/2004 | Garner et al. | 165/274 |
| 6,828,675 B2 | 12/2004 | Memory et al. | |
| 7,106,589 B2 * | 9/2006 | Kiley et al. | 361/700 |
| 7,156,158 B2 | 1/2007 | Ueda et al. | |
| 7,258,161 B2 | 8/2007 | Cosley et al. | |
| 7,286,346 B2 * | 10/2007 | Chiba et al. | 361/679.48 |
| 7,353,859 B2 | 4/2008 | Stevanovic et al. | |
| 7,447,017 B2 | 11/2008 | Koo | |
| 7,448,439 B2 | 11/2008 | Hirafuji et al. | |
| 7,451,806 B2 | 11/2008 | Zhou et al. | |
| 7,452,109 B2 | 11/2008 | Noh et al. | |
| 7,457,126 B2 * | 11/2008 | Ahrens | 361/716 |
| 7,800,907 B2 * | 9/2010 | Huang et al. | 361/700 |
| 2007/0042514 A1 * | 2/2007 | Wu et al. | 438/17 |
| 2008/0285236 A1 * | 11/2008 | Phillips et al. | 361/709 |

\* cited by examiner

*Primary Examiner* — Boris L Chervinsky
(74) *Attorney, Agent, or Firm* — Wall & Tong (57) ABSTRACT

An improved apparatus and system are provided for heat dissipation in a bank of circuit components using heat pipes and/or vapor chambers, wherein the heat pipes and/or vapor chambers efficiently transport heat away from high heat components.

27 Claims, 8 Drawing Sheets

CIRCUIT PACK COOLING SOLUTION

FIELD OF THE INVENTION

The invention relates to circuit pack cooling and, more particularly but not exclusively, to a heat dissipation mechanism for components such as optical networking components.

BACKGROUND

Power dissipation associated with networking equipment is increasing as enhanced functionality is designed into various networking products. With enhanced functionality comes an attendant increase in heat load and heat density.

Some new high-capacity networking products include a bank of optical transceivers known as XFPs (an XFP is a 10 Gigabit/s version of a transceiver device typically known as a small form factor pluggable transceiver or "SFP") placed directly in line, each dissipating 3.5 W. In normal conditions a commercial-grade SFP/XFP, which can operate up to a maximum of 70° C., is preferred. In more extreme conditions industrial-grade SFPs/XFPs are available, which can operate up to a maximum temperature of 85° C. However, industrial-grade SFPs/XFPs are substantially more expensive than commercial ones.

Past solutions to cooling a bank of SFPs or XFPs have included an individual heat sink attached to each SFP or XFP. The problem with this design is that SFPs/XFPs have been observed to operate at temperatures exceeding 85° C.

In addition, heat sinks commonly have fins which may be of the pin-fin design (round vertical fins) to allow for adequate cooling when the air flowing past the heat sink is expected to be in any orientation. The pin-fin design is suboptimal in heat transfer performance relative to parallel-fin heat sinks, which is a detriment of existing solutions. However, in some applications, the use of pin-fin heat sinks is necessary as some products may be operated in different orientations, such as horizontal and vertical modes.

A typical bank of SFPs/XFPs is located on a circuit pack and has limited space and height available in the slot occupied by the circuit pack. A typical circuit pack slot is 25 mm in height. The printed circuit board, backside wiring and components and tolerances can account for 7 to 11 mm of this height. As a typical XFP is 10 mm in height, this leaves 4 to 8 mm for the heat sink, which typically includes fins and the heat sink base. As a consequence, the height of the fins on the heat sink is 7-8 mm at most. This limits the amount of heat that the heat sink can pass to the air. For example, typical pin-fin heat sink assemblies that are 4.2 mm and 6.5 mm tall have manufacture-quoted minimum thermal resistances of 18 C/W and 11.5 C/W and are effective at dissipating heat loads of 1.5 W and 2.5 W, respectively.

Similar thermal challenges are presented by other circuit pack components. For example, networking products include arrays of three or more FBGAs (fine pitch ball grid arrays) that each dissipate 20 W.

In summary, the current solution is deficient as individual heat sinks do not have the ability to adequately dissipate heat to the air under the current space and airflow constraints found in typical circuit packs. This is particularly evident for SFPs and XFPs that are located at the downstream (relative to an incoming airflow) side of a board, where they are required to transfer heat to air that has been heated substantially by the SFPs/XFPs upstream of these components.

It is clear from the above that there is a substantial need for a more efficient means of transporting heat away from networking components (e.g. SFPs, XFPs and other heat generating components) and dissipating it to the ambient air.

SUMMARY

Various deficiencies of the prior art are addressed by an apparatus and system for cooling networking components. Specifically, various embodiments are directed to replacing the inefficient individual clip-on heat sinks with a more efficient means of transporting the heat.

In one embodiment, an apparatus is provided for dissipating heat in a circuit pack having a plurality of heat generating components. The apparatus may include a heat spreader including at least one heat pipe in thermal communication with each of the plurality of heat generating components. In addition, the at least one heat pipe may be arranged to spread heat substantially throughout the heat spreader.

In another embodiment, an apparatus is provided for dissipating heat in a circuit pack having a plurality of heat generating components including at least one heat pipe in thermal communication with at least one of the plurality of heat generating components and a common heat pipe in thermal communication with the at least one heat pipe to move heat toward a heat sinking region.

Another embodiment provides a method of dissipating heat in a circuit pack having a plurality of heat generating components wherein a heat spreader including at least one heat pipe is disposed in thermal communication with a plurality of heat generating components to dissipate thereby at least a portion of generated heat. The at least one heat pipe may be arranged to spread heat substantially throughout the heat spreader.

BRIEF DESCRIPTION OF THE DRAWINGS

Embodiments of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Embodiments of the present invention will be primarily described within the context of a SFP/XFP circuit pack assembly. Those skilled in the art and informed by the teachings herein will realize that such embodiments are also applicable to any circuit pack components that emit heat, such as FBGAs.

In various embodiments, heat pipes or vapor chambers are attached to the SFPs/XFPs. Throughout the Specification the terms heat pipes and vapor chambers may be used interchangeably, with the understanding that a vapor chamber may be considered as a specific type of heat pipe. In this context, a heat pipe may comprise a thin pipe or tube vacuum-sealed with a working/transport fluid/vapor such as for example, water, acetone, methanol, ethanol and the like. The heat pipes may be embedded in, on, or otherwise thermally associated with or formed from a conductive base, such as copper, aluminum, nickel, stainless steel and the like. The advantage of using heat pipes is that they are commercially available, cheap, and are an efficient and reliable means of removing large quantities of heat from one point to another. In addition, the heat pipes may be manufactured thin, substantially flat and/or relatively small (of order 0.5-1 mm thickness). Heat pipes can be individually attached to the SFPs/XFPs or they can be embedded in a conductive base or heat spreader material to aid heat spreading and enhance heat transfer surface area.

One embodiment includes a heat spreader including at least one heat pipe (or vapor chamber) that is attached to the SFPs/XFPs. The heat generated by the SFPs/XFPs may be substantially evenly spread out over the whole area thereby reducing the thermal load on the downstream components. The heat spreader may be in the form of a plate and may also comprise a conductive base. The at least one heat pipe (or vapor chamber) may also be embedded in the heat spreader material. In one embodiment, fins, such as pin-fins or parallel-fins are placed on the heat spreader to help dissipate the heat into the air.

In another embodiment, one or more heat pipes are attached to the SFPs/XFPs and then each heat pipe is attached to one large heat pipe (large implies greater heat removal capacity relative to the individual heat pipes) which in turn is thermally coupled to an optimized heat sink located at or near the slot entrance. In this configuration the heat sink is placed at the entrance to the slot where the air temperature is substantially lower and there is relatively high velocity fluid. In one embodiment the one or more heat pipes may alternatively be embedded in a conductive base.

In another embodiment, one or more heat pipes are attached to the SFPs/XFPs. The heat from each SFP/XFP is removed by attaching each of the heat pipes to a common heat sink that occupies the majority of the optical circuit pack. Still other embodiments combine a variety of the abovementioned features as will be described in greater detail below.

Figure 1:
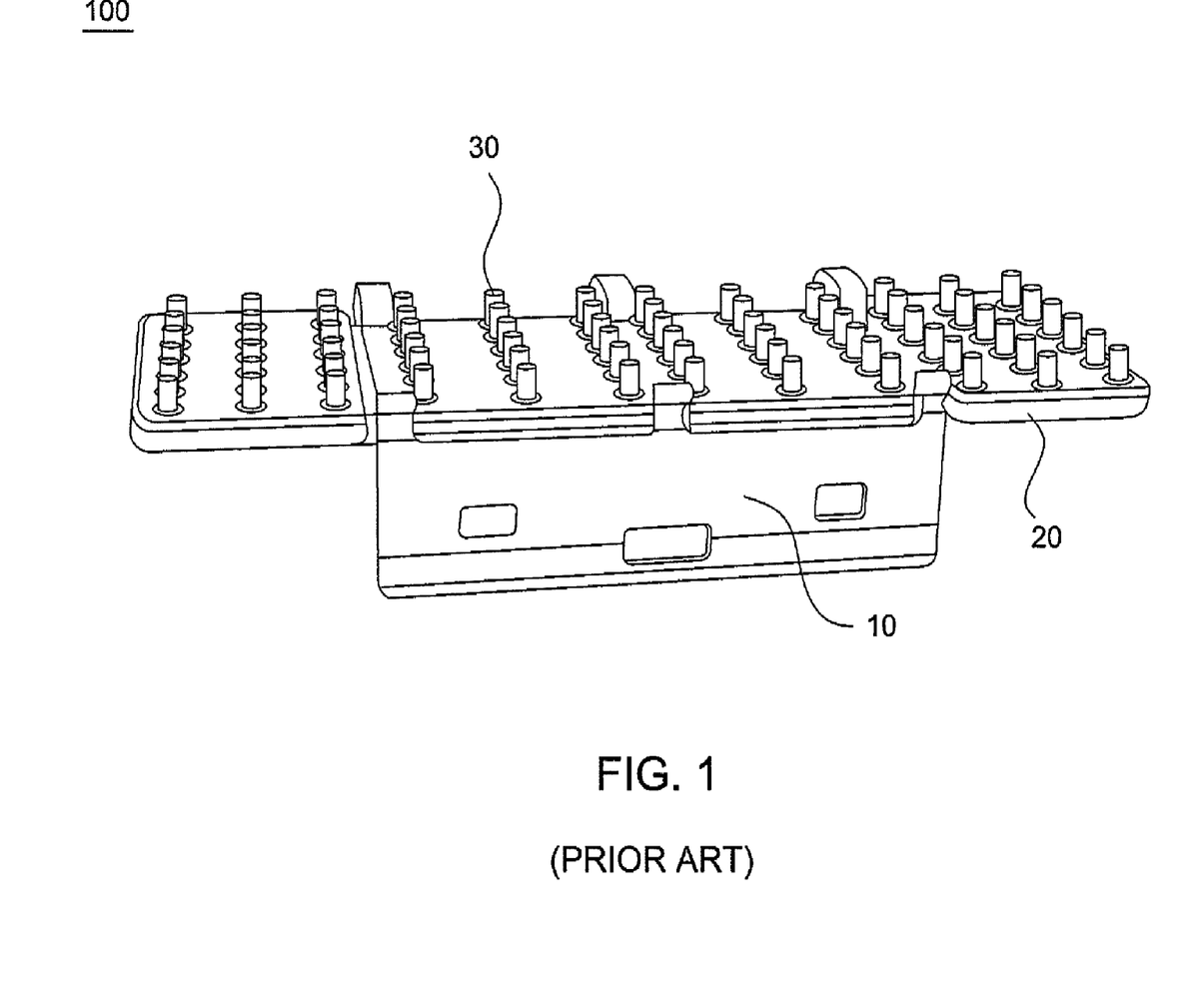
FIG. 1 depicts a typical SFP/XFP heat sink and mounting clip assembly.

FIG. 1 depicts a typical prior art SFP/XFP heat sink and mounting clip assembly 100. Typically, individual heat sinks are attached to each SFP/XFP. Note that the mounting clip 10 and the heat sink 20 are separate pieces. The height of the pin fins 30 (round vertical fins) on the heat sink 20 in many space-constrained applications is at most 7-8 mm. This limits the amount of heat that the heat sink can pass to the air.

In the example shown in FIG. 1 the fins 30 are also of the pin-fin design to allow for adequate cooling when the airflow past the heat sink is expected to be in any orientation. The pin-fin design as shown is suboptimal in heat transfer performance relative to parallel-fin heat sinks, which is a negative of some existing solutions. However, the use of pin-fin heat sinks is sometimes necessary as some products may be operated in different orientations, such as horizontal and vertical modes.

Figure 2A:
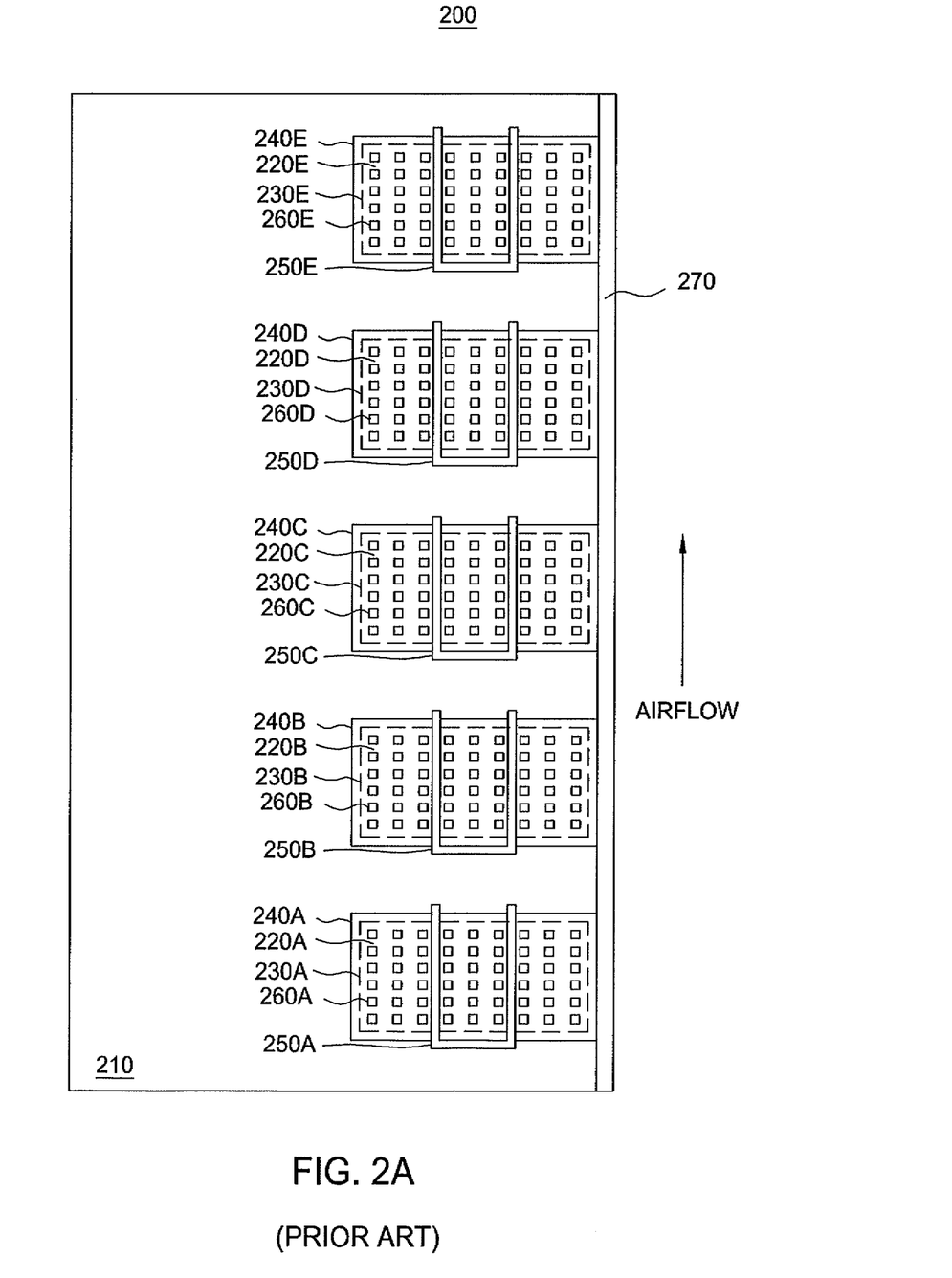
FIG. 2A depicts a top view of a typical circuit board with a bank of SFP/XFP transceivers.

FIG. 2A depicts a top view of a typical circuit pack SFP/XFP bank assembly 200. The SFP/XFP bank assembly includes a circuit board 210 on which components are mounted. The bank of SFPs/XFPs includes a plurality of SFPs and/or XFPs 220A-E arranged as shown in FIG. 2A. An SFP/XFP case 230A-E encloses each of SFPs/XFPs 220A-E. Each of the plurality of SFPs/XFPs 220A-E is associated with one of a plurality of heat sinks 240A-E each of which is individually mounted to one of the corresponding cases 230A-E for each SFP/XFP 220A-E by one of a respective plurality of mounting clips 250A-E. Each of the plurality of mounting clips 250A-E and heat sinks 240A-E may respectively comprise the mounting clip 10 and heat sink 20 of FIG. 1. Each of the heat sinks 240A-E includes a plurality of pin-fins 260A-E for dissipating heat.

Figure 2B:
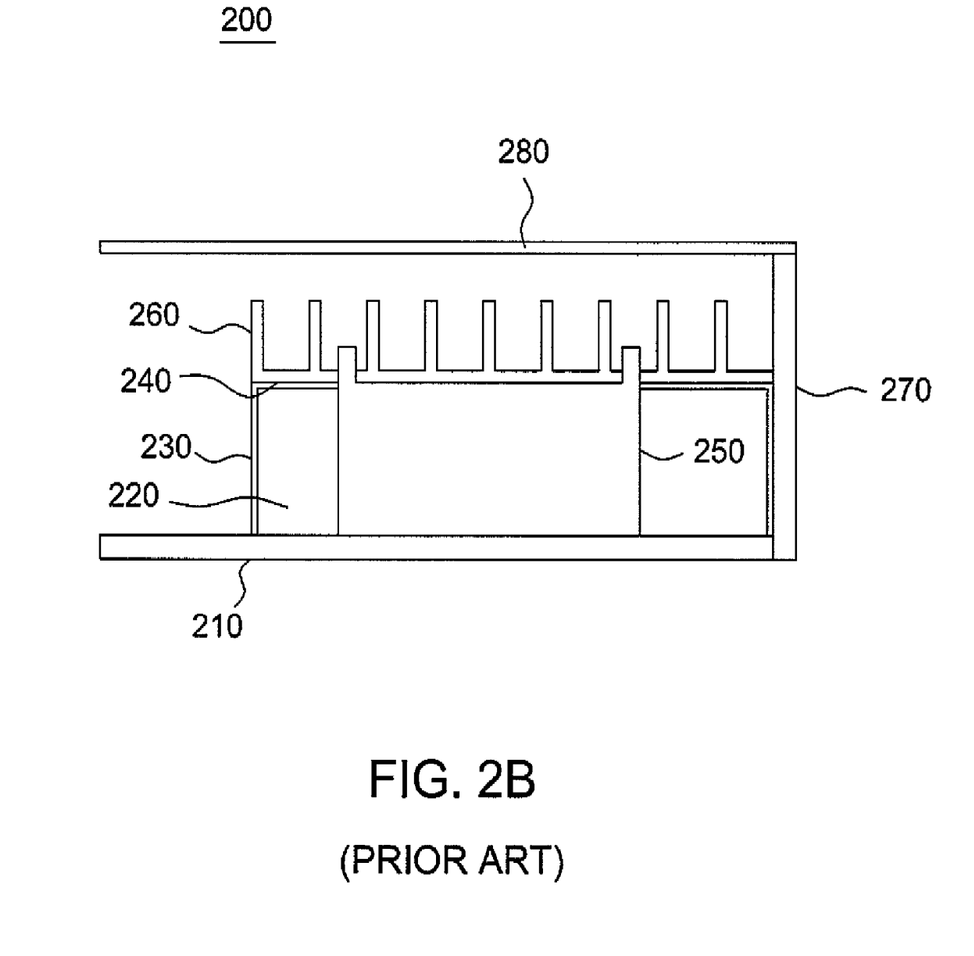
FIG. 2B depicts a front view of the typical circuit board with a bank of SFP/XFP transceivers of FIG. 2A.

A face plate 270 for the circuit pack slot is shown in FIGS. 2A and 2B and the relative direction of airflow into the assembly is show in the figure. By the time circulating air reaches heat sink 240E it has already been heated by thermal transfer from each of the heat sinks 240A-240D. Thus, the SFP/XFP 220E associated with heat sink 240E is the most likely component to exceed the maximum operating temperatures of 70° C., for a commercial grade SFP/XFP, or 85° C., for an industrial grade SFP/XFP.

FIG. 2B depicts a front view of the typical SFP/XFP circuit pack assembly of FIG. 2A. As can be seen in FIG. 2B, the space above the SFP/XFP bank and below the top cover 280 in the circuit pack slot is limited and constrains the maximum height, and consequently the maximum heat dissipation, of the heat sink fins 260.

In summary, the solution shown in FIGS. 1 and 2A-2B is inadequate as individual heat sinks do not have the ability to dissipate heat to the air under the current space and airflow constraints found in circuit packs. At the worst-case conditions, relating to Network Equipment Building System's (NEBS) 50° C. inlet air temperature and 1800 m altitude, the SFPs and XFPs in the arrangement of FIGS. 2A-2B are known to operate at temperatures greater than 85° C. Thus, even the higher temperature rating for industrial grade SFPs and XFPs is exceeded, even with individual heat sinks attached to each XFP. Providing adequate cooling is also difficult since the equipment is subject to strict NEBS regulations where cooling fans cannot operate above 65 dBA, which implies that increasing the fan speed to supply more cool air is not a practical solution.

In addition, a typical assembly has limited space and height available in the circuit pack casing. A typical slot is 25 mm in height. The height of a typical SFP/XFP, printed circuit board, backside wiring and components and associated tolerances ranges from 17 to 21 mm, leaving 4 to 8 mm for the heat sink, which typically includes fins and the heat sink base. As a consequence, the pin fins (round vertical fins) on the heat sink are not very tall (7-8 mm at most). This restricted fin height limits the amount of heat that the heat sink can pass to the air.

The deficiency of the solution shown in FIGS. 1 and 2A-2B is particularly evident for SFPs/XFPs that are located at the downstream side of a board (downstream from the incoming airflow), where they are required to transfer heat to air that has been heated substantially by the SFPs/XFPs upstream of these components.

Figure 3A:
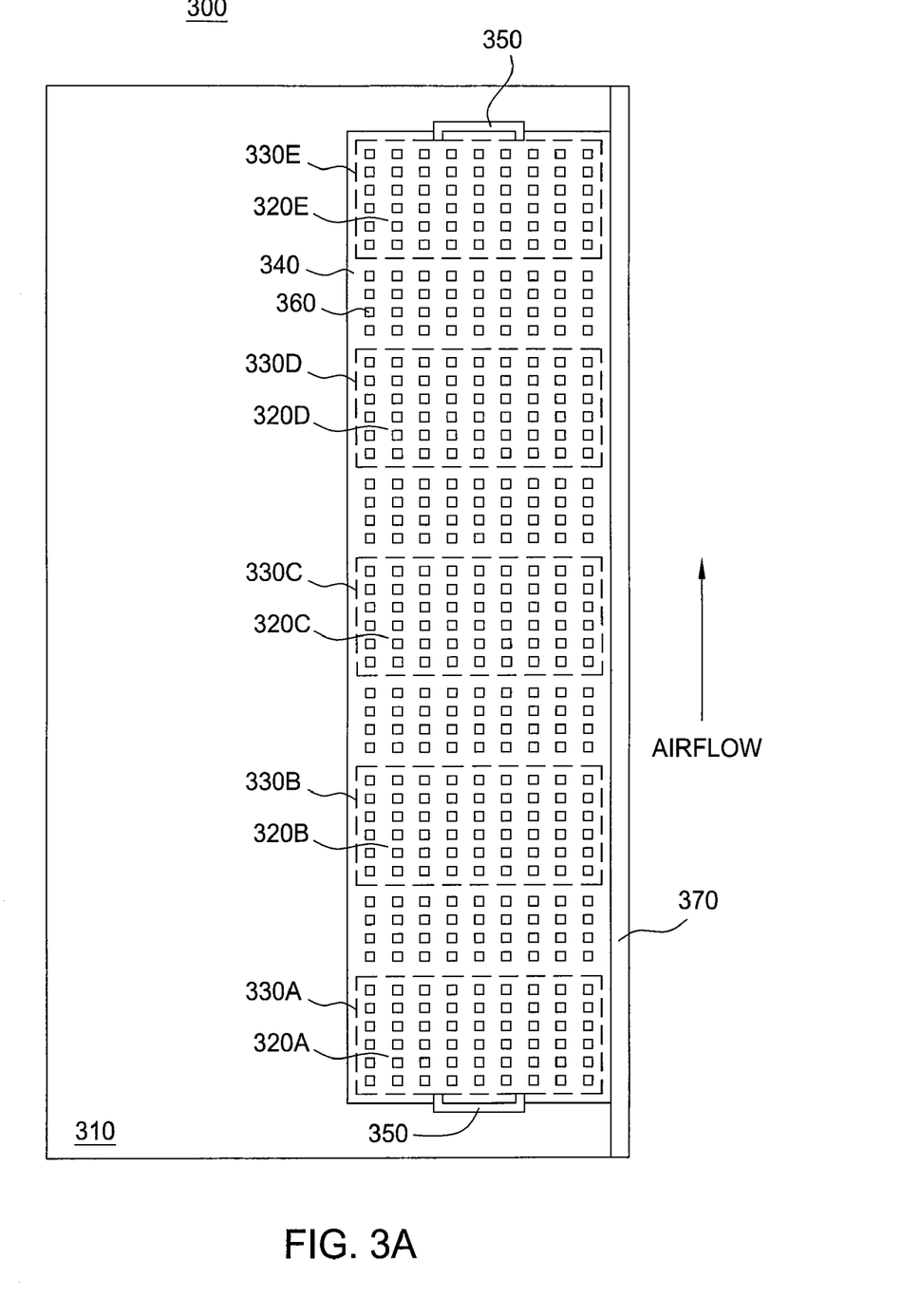
FIG. 3A depicts a top view of an exemplary heat spreader assembly according to one embodiment.
Figure 3B:
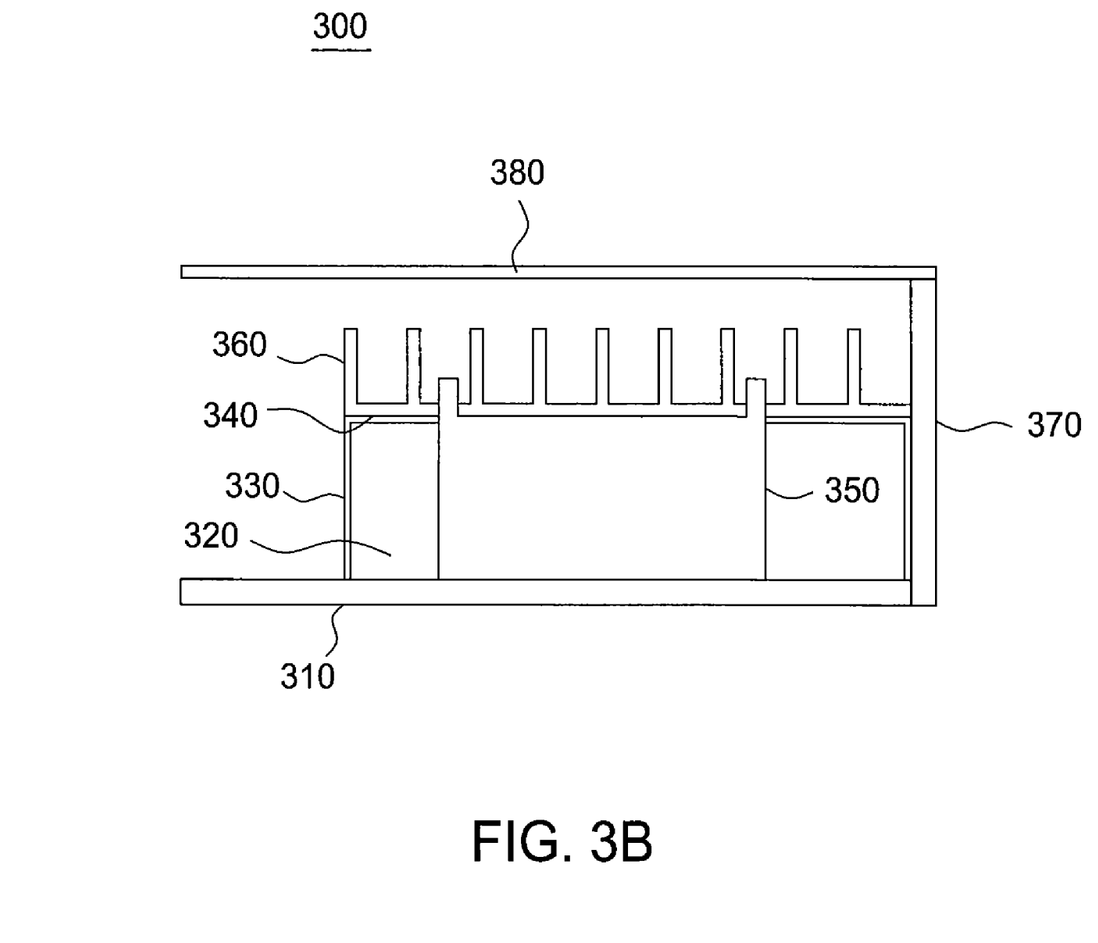
FIG. 3B depicts a front view of the exemplary heat spreader assembly of FIG. 3A.

FIGS. 3A and 3B depict top and front views of an exemplary heat spreader assembly according to one embodiment. Compared to the solution depicted in FIGS. 1, 2A and 2B, the inefficient individual clip-on heat sinks are replaced with a more efficient means of transporting the heat. The assembly 300 includes a circuit board 310 on which components are mounted, a front cover 370, mounting clips 350, and a top cover 380 (shown only in FIG. 3B). The assembly 300 also includes a heat spreader 340 including one or more heat pipes (or vapor chambers) that is attached to the cases 330A-E of the SFPs/XFPs 320A-E. The heat spreader 340 may comprise a conductive base and may be in the shape of a plate, a disk, waffle or other pattern as may be devised consistent with the teachings herein. In one embodiment, the one or more heat pipes (or vapor chambers) are embedded in the heat spreader material. The advantage of using heat pipes is that they can be manufactured very thin (0.5 mm-1 mm), have a large heat transfer capacity and exhibit very low thermal resistance. Since the heat spreader plate 340 is in thermal communication with the SFPs/XFPs 320A-E, by way of the embedded heat pipes or vapor chambers, the heat generated by the SFPs/XFPs 320A-E is substantially evenly spread out over the whole area above the SFP/XFP bank. Although a bank of five SFPs/XFPs is shown in FIG. 3A, more or less SFPs/XFPs, may be included in the assembly without departing from the teachings of the disclosure herein.

As discussed above with respect to the prior art solution of FIGS. 2A-2B, the SFPs/XFPs furthest from the direction of the incoming air flow (e.g. SFP/XFP 320E) are the most prone to overheating and have the highest operating temperatures. In contrast, the SFPs/XFPs closest to the incoming air flow have the lowest operating temperatures (e.g. SFP/XFP 320A).

In the embodiment of FIGS. 3A-3B, the heat spreading capability of the heat spreader 340 facilitates a more uniform temperature distribution over the SFPs/XPFs (e.g. SFPs/XFPs 320A-E) compared to that observed over SFPs/XFPs 220A-E in FIGS. 2A-2B. While the heat of SFP/XFP 320A may be relatively greater than that of SFP/XFP 220A in FIGS. 2A-2B, the operating temperatures of all SFPs/XFPs 320A-E are below the maximum operating temperatures for the SFPs/XFPs.

In one embodiment, fins 360 can be placed on the heat spreader 340 to help dissipate the heat into the air. As depicted in the embodiment of FIGS. 3A-3B, the fins 360 are pin-fins. In another embodiment, the fins 360 are parallel-fins. Other fin arrangements are possible without departing from the teachings herein.

Figure 4A:
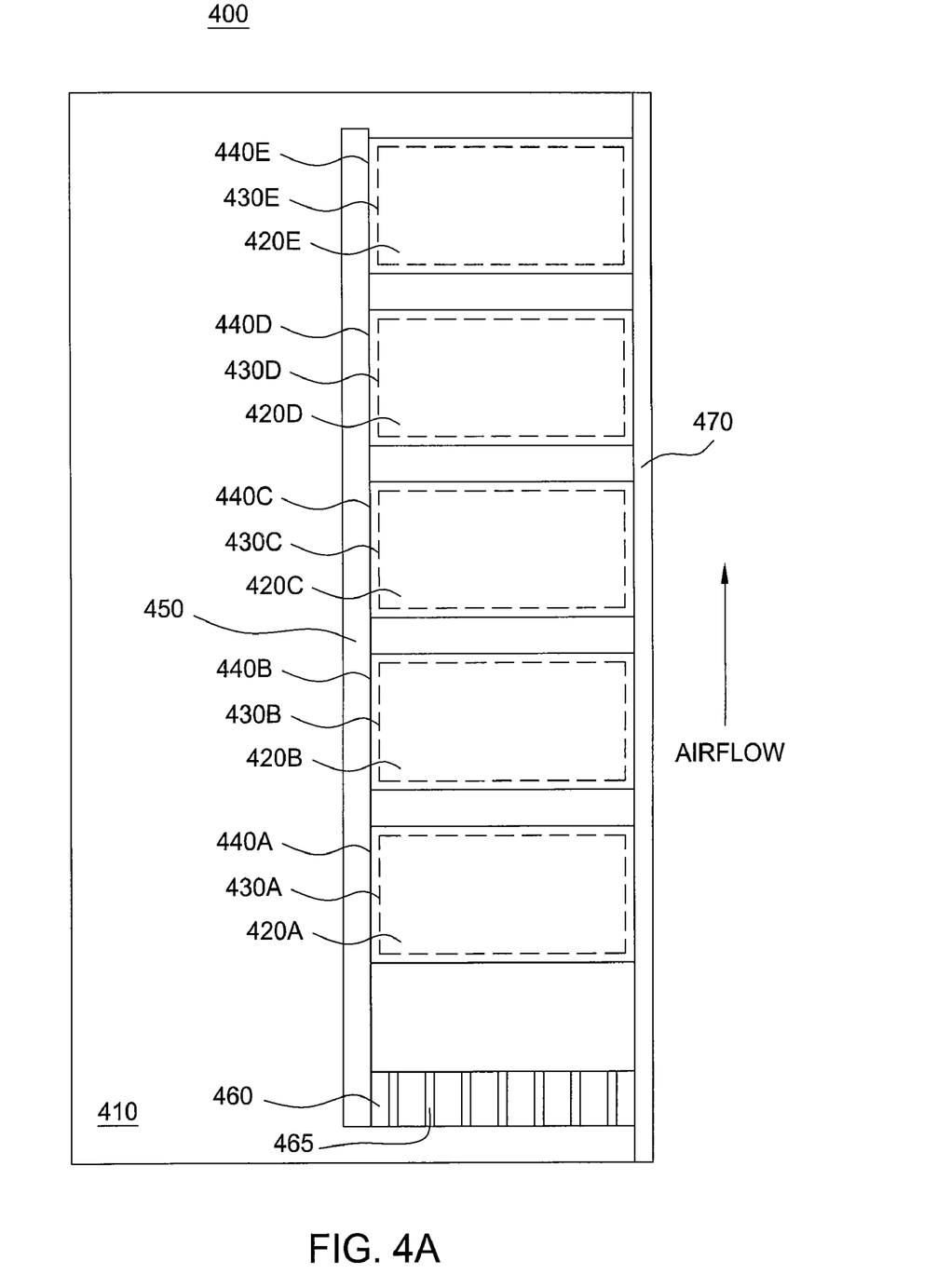
FIG. 4A depicts a top view of an exemplary heat dissipation assembly according to one embodiment.
Figure 4B:
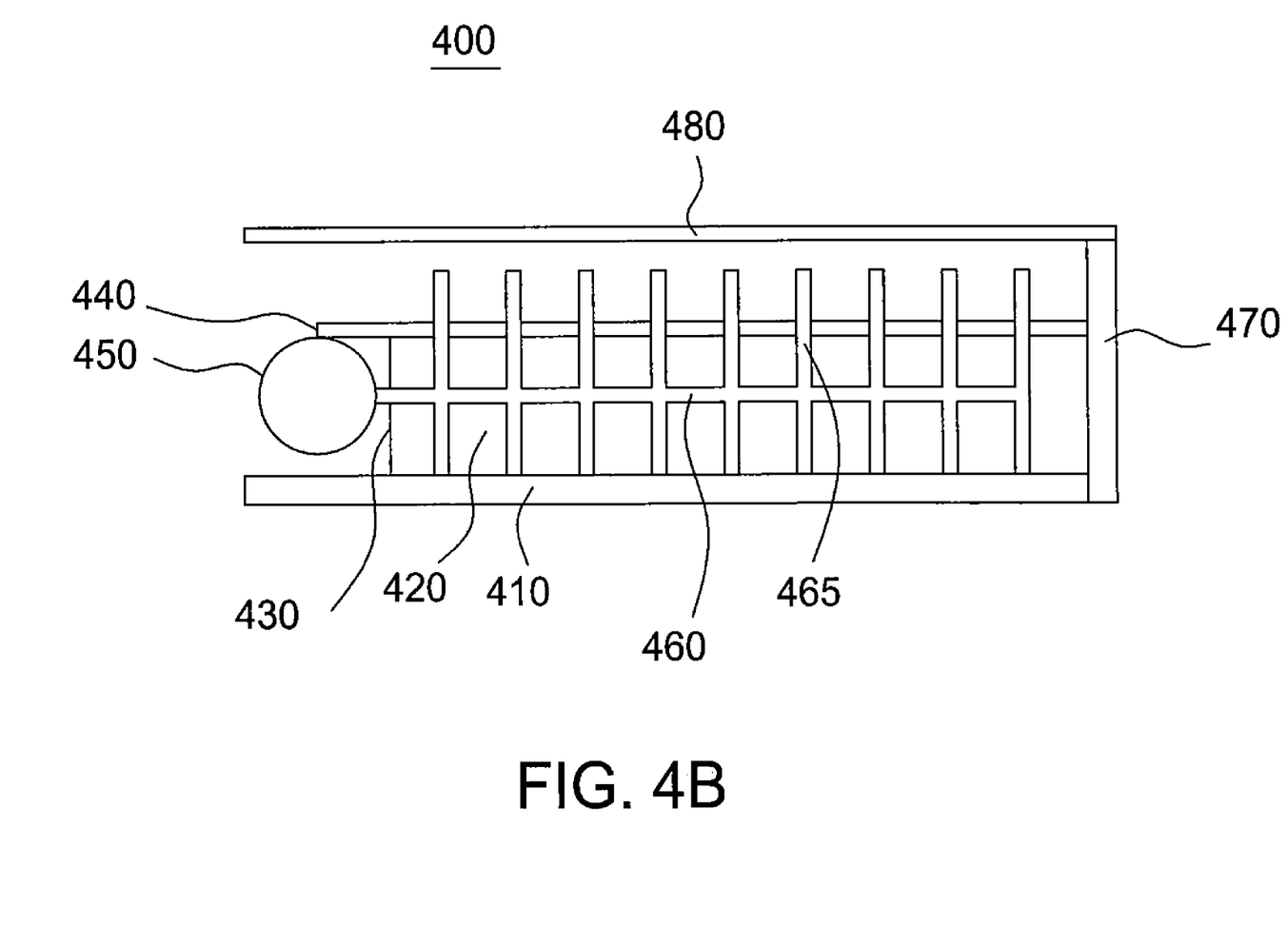
FIG. 4B depicts a front view of the exemplary heat dissipation assembly of FIG. 4A.

FIGS. 4A and 4B depict top and front views of an exemplary heat dissipation assembly according to one embodiment.

Compared to the solution depicted in FIGS. 1, 2A and 2B, the inefficient individual clip-on heat sinks are replaced with a more efficient means of transporting the heat. The assembly 400 includes a circuit board 410 on which components are mounted, a front cover 470, and a top cover 480 (shown only in FIG. 4B). The assembly 400 also includes one or more heat pipe units 440A-E each of which may comprise one or more heat pipes (or vapor chambers) attached to the cases 430A-E of the SFP/XFPs 420A-E. In one embodiment, the heat pipes comprising the heat pipe units 440A-E may be embedded in one or more conductive bases. The circuit board 410, front cover 470, top cover 480, cases 430A-E and SFPs/XFPs 420A-E are substantially the same as circuit board 310, front cover 370, top cover 380, cases 330A-E and SFPs/XFPs 320A-E depicted in FIGS. 3A-3B. The heat pipe units 440A-E are attached to a large heat pipe 450 common to the heat pipe units 440A-E. The large heat pipe 450 is connected to a heat sink fin assembly 460. It is to be understood that "large" in this context implies having a greater heat transfer capacity relative to the individual heat pipe units 440A-E and is not strictly related to the physical size of the pipe.

As shown in FIG. 4A, the heat sink fin assembly 460 is located in a region of the circuit pack unoccupied by an SFP/XFP. This permits a greater fin height and thus a greater heat dissipation capacity than the short fins associated with typical heat sinks such as in FIGS. 1 and 2A-2B. The embodiment of FIGS. 4A-4B is advantageous in that it is arranged to efficiently transport heat away from the SFPs/XFPs 420A-E and to a region where heat can be more efficiently transmitted to the surroundings. In one embodiment, the heat sink fin assembly 460 is located near the entrance slot to the SFP/XFP bank where the air temperature is much lower and where there is a relatively high velocity air flow. While such an arrangement is advantageous, the location of the heat sink fin assembly 460 is not so limited and may be placed at other locations on the circuit pack 410. In addition, in one embodiment the heat sink fins comprise parallel fins 465 (as shown in FIGS. 4A-4B). In another embodiment the heat sink fins comprise pin fins. Other fin arrangements are possible without departing from the teachings herein.

In one embodiment, the features of FIGS. 3A-3B and FIGS. 4A-4B are incorporated into the same assembly. In this embodiment, one or more heat pipe units, such as components 440A-E of FIG. 4A-4B, are attached to the SFPs/XFPs, such as SFPs/XFPs 420A-E in FIGS. 4A-4B. Each of the heat pipe units is then attached to a common heat sink for heat dissipation that occupies the majority of the optical circuit pack. In one embodiment, the common heat sink comprises the heat spreader plate 340 in FIGS. 3A-3B which includes embedded heat pipes (or vapor chambers) for additional heat spreading. In addition, in one embodiment the common heat sink includes fins, such as pin fins or parallel fins, for additional heat transfer capability.

Figure 5:
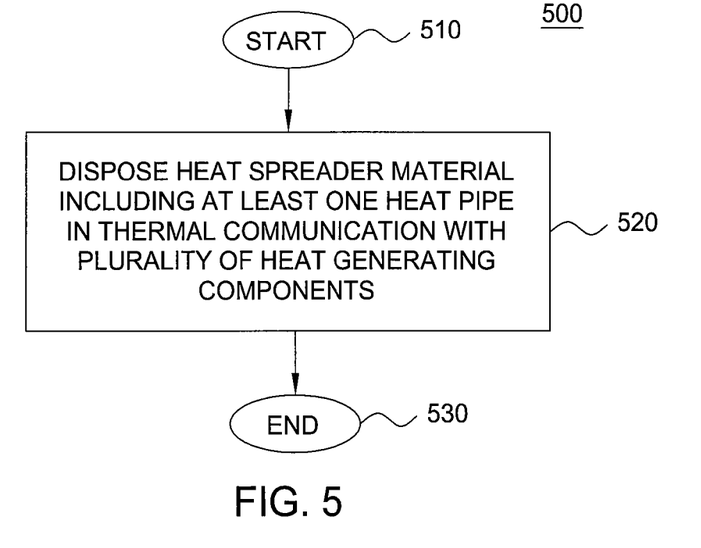
FIG. 5 depicts a method of dissipating heat in a circuit pack according to one embodiment.

FIG. 5 depicts a flow diagram of a method 500 of dissipating heat in a circuit pack according to one embodiment. The method 500 is initiated at step 510 and proceeds to step 520. At step 520, a heat spreader including at least one heat pipe is disposed in thermal communication with a plurality of heat generating components of a circuit pack in order to dissipate at least a portion of the heat generated by the circuit pack components. The method 500 exits at step 530.

The at least one heat pipe may be arranged to spread heat substantially throughout the heat spreader material. The heat spreader may comprise a conductive base and may be in the shape of a plate, a disk, waffle or other pattern as may be devised consistent with the teachings herein. In one embodiment, the at least one heat pipe (or vapor chamber) may be embedded in, on, or otherwise in thermal association with the heat spreader material. The heat spreader may comprise the heat spreader 340 discussed and depicted with respect to FIGS. 3A and 3B. The heat spreader may additionally comprise any or all of the additional features discussed and depicted with respect to the heat spreader 340 of FIGS. 3A and 3B.

Figure 6:
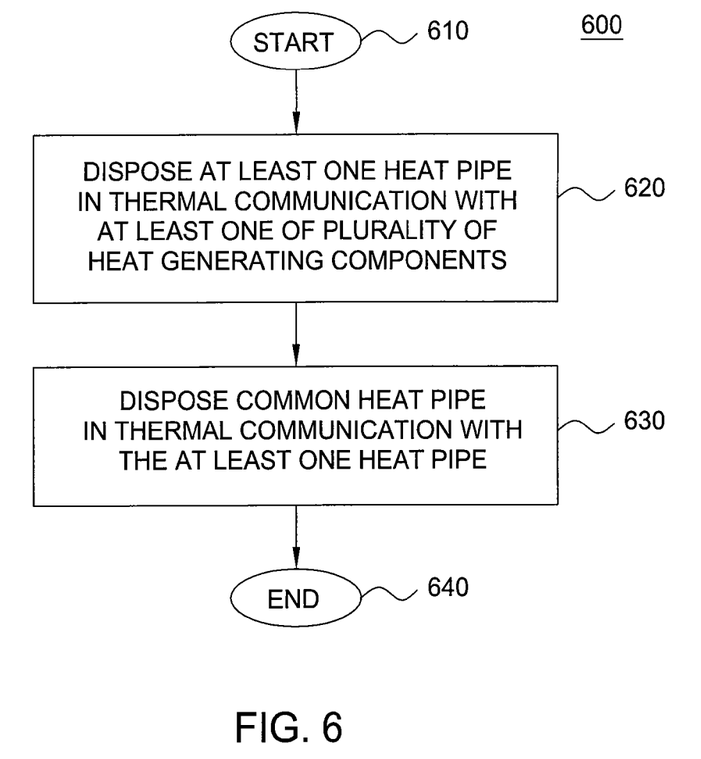
FIG. 6 depicts a method of dissipating heat in a circuit pack according to one embodiment.

FIG. 6 depicts a flow diagram of a method 600 of dissipating heat in a circuit pack according to one embodiment. The method 600 is initiated at step 610 and proceeds to step 620. At step 620, at least one heat pipe is disposed in thermal communication with at least one of a plurality of heat generating components. At step 630 a common heat pipe is disposed in thermal communication with the at least one heat pipe in order to dissipate at least a portion of the heat generated by the circuit pack components. The method 600 exits at step 640.

The common heat pipe may be configured to move heat toward a heat sinking region. The at least one heat pipe may be included in or may comprise one of the heat pipe units 440A-E depicted and described with respect to FIGS. 4A and 4B. In addition, the common heat pipe may comprise the large heat pipe 450 depicted and described with respect to FIGS.

4A and 4B. The at least one heat pipe and/or the common heat pipe may additionally comprise any or all of the additional features of the heat pipe units 440A-E or the large heat pipe 450 discussed and depicted with respect to FIGS. 4A and 4B.

In one embodiment, the methods of FIGS. 5 and 6 are combined such that the operations of step 520 are followed by the operations of steps 620 and 630. Alternatively, steps 620 and 630 may precede step 520. In addition, the combined method may provide for the substantially contemporaneous operations of steps 520, 620 and/or 630.

The various embodiments described herein are advantageous because: (1) larger heat dissipation rates can be achieved with the use of heat pipes and vapor chambers compared to standard air cooling approaches; (2) the stringent NEBS requirements are met more easily, as the system is no longer limited by the SFPs/XFPs that are located downstream on the board. This is because in the new solution the efficient heat spreading allows the downstream SFPs/XFPs to operate at temperatures intermediate between the coldest and hottest SFPs and XFPs in the original pack; (3) future SFPs/XFPs may dissipate more heat and heat pipes will be able to manage this increased heat load; (4) the solution is completely interchangeable with easy connect and disconnect fixtures that are standard in current SFP/XFP heat sink designs; (5) the solution permits the use of cheaper commercial-grade SFPs/XFPs; (6) heat pipes or vapor chambers can be embedded in heat sink bases thereby improving their heat spreading ability; heat pipes can be manufactured very thin (0.5-1 mm) thereby allowing more height for heat sink fins providing much improved heat transfer; (7) heat pipes can be manufactured in many different shapes facilitating necessary bends and cuts depending on the circuit pack layout; (8) while this specification describes embodiments in the context of cooling SPFs and XFPs, this technology can be used to provide a total cooling solution to all the components on the circuit pack; (9) because the heat pipes can be manufactured very thin it is possible that both sides of the board can be cooled, and; (10) a lower fan speed can be used for the same chip operating temperature and this has a positive impact on acoustic noise levels and reliability.

While the foregoing is directed to various embodiments, other and further embodiments of the invention may be devised without departing from the basic scope thereof; for example, cooling solutions in accordance with the described embodiments for other configurations for the SFP/XFP bank on the circuit board such as a rectangular layout. As such, the appropriate scope of the invention is to be determined according to the claims, which follow.

What is claimed is:

1. An apparatus for dissipating heat in a circuit pack having a plurality of heat generating components, comprising:
    a heat spreader, including a thermally conductive base, in thermal communication with the plurality of heat generating components to extract heat therefrom;
    one or more heat pipes associated with the heat spreader and in thermal communication with respective heat generating components to extract heat therefrom; and
    a common heat pipe in thermal communication with the one or more heat pipes to extract heat therefrom;
    wherein the common heat pipe is in thermal communication with a heat sink to convey heat thereto.

2. The apparatus of claim 1, wherein the plurality of heat generating components are small form-factor pluggable transceivers (SFP).

3. The apparatus of claim 2, wherein the small form-factor pluggable transceivers are XFPs.

4. The apparatus of claim 1, wherein the heat spreader further comprises fins for dissipating heat.

5. The apparatus of claim 4, wherein the fins are pin fins.

6. The apparatus of claim 4, wherein the fins are parallel fins.

7. The apparatus of claim 1, wherein the common heat pipe is in thermal communication with a heat dissipating fin assembly.

8. The apparatus of claim 1, wherein the one or more heat pipes are embedded in one or more conductive bases.

9. An apparatus for dissipating heat in a circuit pack having a plurality of heat generating components, comprising:
    at least one heat pipe including a thermally conductive base, the at least one heat pipe for spreading heat throughout the thermally conductive base, said at least one heat pipe in thermal communication with a respective one of the plurality of heat generating components to extract heat therefrom; and
    a common heat pipe in thermal communication with the at least one heat pipe to move heat toward a heat sinking region.

10. The apparatus of claim 9, wherein the common heat pipe is in thermal communication with a heat dissipating fin assembly.

11. The apparatus of claim 10, wherein the heat dissipating fin assembly comprises pin fins.

12. The apparatus of claim 10, wherein the heat dissipating fin assembly comprises parallel fins.

13. The apparatus of claim 9, wherein the at least one heat pipe comprises a vapor chamber.

14. A circuit pack system, comprising:
    a plurality of heat generating components;
    a heat spreader, including a thermally conductive base, in thermal communication with the plurality of heat generating components to extract heat therefrom;
    one or more heat pipes associated with the heat spreader and in thermal communication with respective heat generating components to extract heat therefrom; and
    a common heat pipe in thermal communication with the one or more heat pipes to extract heat therefrom;
    wherein the common heat pipe is in thermal communication with a heat sink to convey heat thereto.

15. The circuit pack system of claim 14, wherein the plurality of heat generating components are small form-factor pluggable transceivers (SFPs).

16. The circuit pack system of claim 15, wherein the small form-factor pluggable transceivers are XFPs.

17. The circuit pack system of claim 14, wherein the heat spreader further comprises fins for dissipating heat.

18. The circuit pack system of claim 17, wherein the fins are pin fins.

19. The circuit pack system of claim 17, wherein the fins are parallel fins.

20. The circuit pack system of claim 14 wherein the common heat pipe is in thermal communication with a heat dissipating fin assembly.

21. A circuit pack system, comprising:
    a plurality of heat generating components;
    at least one heat pipe including a thermally conductive base, the at least one heat pipe for spreading heat throughout the thermally conductive base, said at least one heat pipe in thermal communication with a respective one of the plurality of heat generating components to extract heat therefrom; and
    a common heat pipe in thermal communication with the at least one heat pipe to move heat toward a heat sinking region.

22. The circuit pack system of claim 21 wherein the common heat pipe is in thermal communication with a heat dissipating fin assembly.

23. The circuit pack system of claim 22, wherein the heat dissipating fin assembly comprises pin fins.

24. The circuit pack system of claim 22, wherein the heat dissipating fin assembly comprises parallel fins.

25. The circuit pack system of claim 21, wherein the at least one heat pipe comprises a vapor chamber.

26. A method of dissipating heat in a circuit pack having a plurality of heat generating components comprising:
   disposing at least one heat pipe in thermal communication with a respective one of the plurality of heat generating components and a common heat pipe in thermal communication with the at least one heat pipe to dissipate thereby at least a portion of the generated heat; wherein the common heat pipe in thermal communication with the at least one heat pipe is configured to move heat toward a heat sinking region; and
   disposing a heat spreader including at least one heat pipe and a thermally conductive base, the at least one heat pipe for spreading heat throughout the thermally conductive base, said at least one heat pipe in thermal communication with the plurality of heat generating components to dissipate thereby at least a portion of generated heat;
   wherein the heat spreader is in thermal communication with a heat sink to convey heat thereto.

27. A method of dissipating heat in a circuit pack having a plurality of heat generating components, comprising:
   disposing at least one heat pipe including a thermally conductive base, the at least one heat pipe for spreading heat throughout the thermally conductive base, said at least one heat pipe in thermal communication with a respective one of the plurality of heat generating components to extract heat therefrom;
   disposing a common heat pipe in thermal communication with the at least one heat pipe to dissipate thereby at least a portion of generated heat;
   wherein the common heat pipe in thermal communication with the at least one heat pipe is configured to move heat toward a heat sinking region.

* * * * *